United States Patent
Berigei et al.

(10) Patent No.: US 7,558,720 B1
(45) Date of Patent: Jul. 7, 2009

(54) DYNAMIC COMPUTATION OF ESD GUIDELINES

(75) Inventors: Rajesh R. Berigei, San Jose, CA (US); Elroy Lucero, San Jose, CA (US); Sury Maturi, San Jose, CA (US); Marcel A. ter Beek, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 296 days.

(21) Appl. No.: 11/328,003

(22) Filed: Jan. 9, 2006

Related U.S. Application Data

(60) Provisional application No. 60/718,433, filed on Sep. 19, 2005.

(51) Int. Cl.
*G06F 17/50* (2006.01)

(52) U.S. Cl. .............................. 703/14; 716/5; 702/117; 702/118

(58) Field of Classification Search .................. 703/14; 716/5, 10; 361/56; 702/117, 118; 438/14; 257/48, 355

See application file for complete search history.

(56) References Cited

U.S. PATENT DOCUMENTS

| | | | |
|---|---|---|---|
| 6,526,548 B1 * | 2/2003 | Voldman | 716/5 |
| 6,898,546 B2 * | 5/2005 | Neunhoeffer et al. | 702/118 |
| 2002/0024045 A1 * | 2/2002 | Hayashida et al. | 257/48 |
| 2002/0076840 A1 * | 6/2002 | Englisch | 438/14 |
| 2004/0240131 A1 * | 12/2004 | Leete | 361/56 |
| 2005/0005253 A1 * | 1/2005 | Strickland et al. | 716/5 |
| 2005/0162790 A1 * | 7/2005 | Yoshinaga | 361/56 |
| 2006/0041397 A1 * | 2/2006 | Kemper et al. | 702/117 |
| 2006/0043488 A1 * | 3/2006 | Husher | 257/355 |
| 2006/0075368 A1 * | 4/2006 | Bakir et al. | 716/10 |
| 2007/0165344 A1 * | 7/2007 | Esmark et al. | 361/56 |

* cited by examiner

*Primary Examiner*—Paul L Rodriguez
*Assistant Examiner*—Kandasamt Thangavelu
(74) *Attorney, Agent, or Firm*—Dergosits & Noah LLP

(57) ABSTRACT

An automated method for checking electrostatic discharge (ESD) guidelines ensures that a sufficient number of ESD protection cells have been provided in the neighborhood of each pad in an integrated circuit design to ensure adequate current sinking and voltage clamping during the occurrence of an ESD event.

1 Claim, 1 Drawing Sheet

US 7,558,720 B1

DYNAMIC COMPUTATION OF ESD GUIDELINES

CLAIM OF PRIORITY

This application claims the benefit of and priority to U.S. Provisional Application No. 60/718,433, filed on Sep. 19, 2005. Provisional Application No. 60/718,433 is hereby incorporated by reference in its entirety.

TECHNICAL FIELD

The present invention relates to integrated circuit design and, in particular, to the automated checking of the design guidelines for an integrated circuit to ensure that a sufficient number of properly sized and optimally located electrostatic discharge (ESD) protection elements have been provided in the circuit design.

DESCRIPTION OF THE INVENTION

Figure 1:
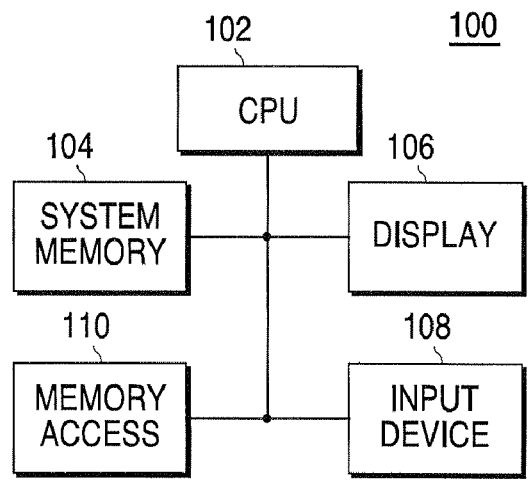
FIG. 1 is a block diagram illustrating a conventional data processing system.

A single integrated circuit chip can contain upwards of millions of transistors and other active circuit elements. As the complexity, functionality and speed of these devices increases, it is becoming much more difficult to design, layout and test these chips to meet their target performance specification. Often, several iterations of design, layout and testing are required before a commercially viable chip is satisfactorily defined.

In designing an integrated circuit, engineers typically rely upon computer simulation tools to create a schematic design of the circuit that comprises individual circuit elements that are connected together to perform a specified function. The circuit schematic is then converted into a physical representation, or layout, that can be transferred onto a silicon surface. Computer aided design (CAD) tools are used to translate the discrete circuit elements into physical shapes that will embody the actual circuit devices in the completed IC.

The software programs utilized in the CAD tools are structured to function under a set of predefined design rules that are determined by processing and design limitations. For example, the design rules may define the space tolerance between devices or interconnect lines to ensure that the devices and lines do not interact with one another in an undesirable way. When the circuit layout has been completed, CAD tools are again utilized to convert the layout to a "netlist" of the circuit; a netlist is a list of all logic gates and their interconnections that make up the integrated circuit. This netlist is used to verify the physical layout of the design. The physical layout is then used to create a mask set for use in the actual physical fabrication of the integrated circuit chip. Automated tools and procedures for the design, layout and testing of integrated circuits are well known to those skilled in the art.

One of the factors to be considered in designing an IC chip is its susceptibility to electrostatic discharge (ESD). Given the decreasing size of circuit features, exposure to even a small amount of environmentally generated static electricity can cause an IC to fail.

An electrostatic discharge typically occurs when the IC is touched by someone handling the IC chip before or after packaging, when a packaged IC slides on its pins over another surface, or generally whenever the IC is exposed to static electricity. Damage from ESD accounts for a large percentage of the ICs returned to manufacturers by customers. Therefore, IC designs typically include ESD protection devices that are manually added into the circuit design based upon a set of ESD guidelines. ESD guidelines are currently specified for each process technology and I/O library type based upon detailed ESD circuit simulations. Various types of ESD protection devices are well known to those skilled in the art.

The present invention provides a method for checking the ESD guidelines to ensure that a sufficient number of ESD protection elements are automatically provided in the circuit design in the neighborhood of each circuit pad to ensure adequate current sinking and voltage clamping during the occurrence of an ESD event.

The concept of the present invention for the dynamic computation of ESD guidelines is to provide calculation functionality in the ESD guidelines. The calculator is triggered when the ESD guidelines checker is run. The following provides an example esdcheck.tech file:

```
esdlibrary cmos7_3v {
    Domain_definition {
        VDDIO {
            protectiondevices {VDDIOMC}
            numberofdevices {>=3}
            distanceinmicrons {<1000}
        }
        viocalc {
            protectiondevices {BWPWRMC BWGNDMC 00BWRMC}
            calculate {numberofdevices, distanceinmicrons}
        }
    }
}
```

With reference to the above sample esdtech.check file, any ESD domain can include a keyword "calculate." When the ESD guidelines checker parses the keyword, it triggers a calculator function to compute the recommended number of ESD devices and the optimum size and dispersion of the ESD protection cells around a pad.

The calculator function can be implemented in a number of languages, including TCL, C/C++ and Skill. If the function is defined in C/C++, it is compiled and loaded into a TCL interpreter.

The calculator function is defined such that a Spice simulation can be invoked and the results post-processed and computed to obtain the needed parameters. The calculate function should be able to iteratively run simulation and analysis in order to achieve the above-stated goals.

An example of psuedo-code for such a calculator function is as follows:

Proc calculate {parameter1, parameter2}
    Setup an ESD simulation environment for the design for the needed process.
    Run ESD simulations on the design.
    Post process simulation results to identify required number of ESD protection devices needed.
    Post process simulation results to identify minimum distance that is required to place the protection devices.
    Do simulate/analysis iterations to compute optimum number of ESD elements.

FIG. 1 shows a well-known general architecture of a data processing system 100 that can be utilized to execute a program implementation of a method of checking ESD guidelines in accordance with the concepts of the present invention. The data processing system 100 includes a central processing unit (CPU) 102 and a system memory 104 that is connected to the CPU 102. The system memory 104 typically stores the operating system for the CPU 102 as well as data and various sets of program instructions for applications programs to be executed by the system 100. For example, the system memory 104 could store a software program, i.e. a sequence of machine-readable program instructions, needed to implement a method for checking ESD guidelines in accordance with the invention. Typically, the computer system 100 also includes a display 106 that is connected to the CPU 102 to allow images to be visually displayed to a user, a user input system 108, e.g. a mouse or keyboard, that allows the user to interact with the system 100, and a memory access system 110 that enables transfer of data both within the system 100 and between the system 100 and systems external to the system 100, e.g. a computer network to which the system 100 is connected. All of these components and the ways in which they interact are well known to persons skilled in the art.

Figure 2:
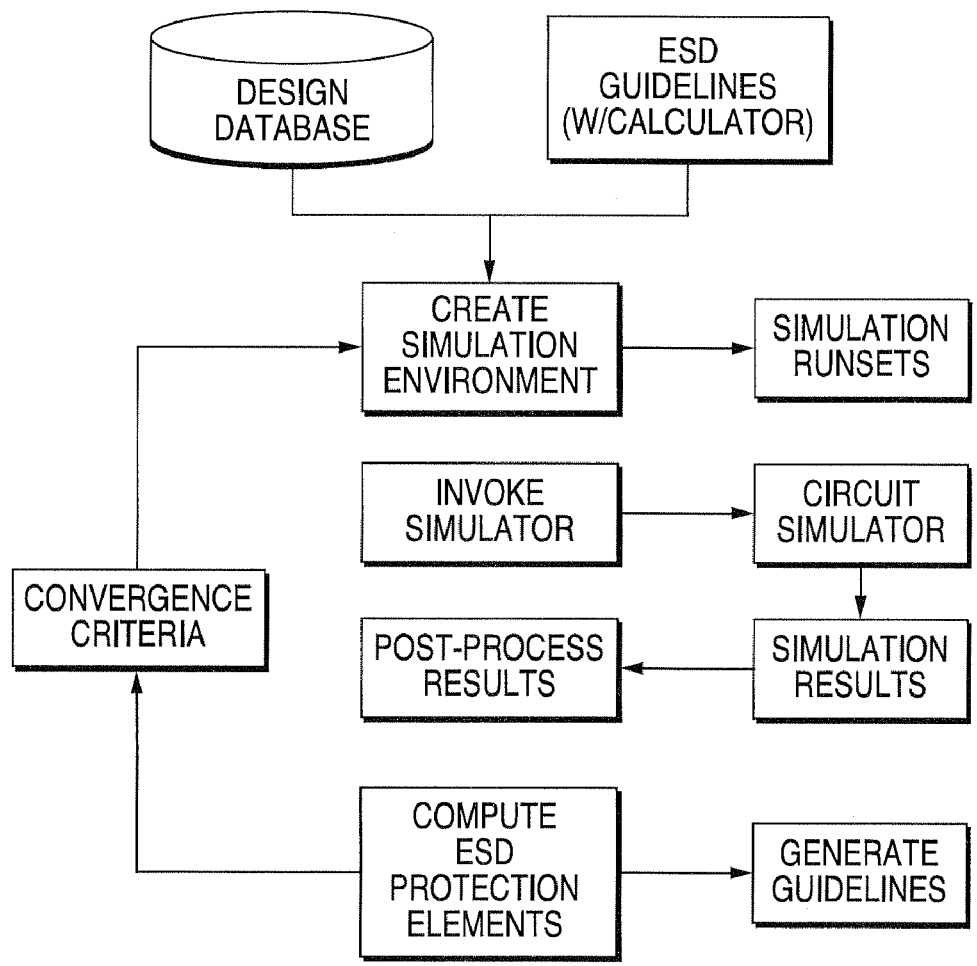
FIG. 2 is flow chart illustrating a method for the dynamic computation and checking of ESD guidelines in accordance with the concepts of the present invention.

FIG. 2 provides a flow chart of an ESD guidelines checker technique in accordance with the present invention. As shown in FIG. 2, the process begins by providing the design database for an integrated circuit and ESD guidelines that include the calculator function described above as inputs to an ESD simulation environment; the ESD simulation environment is set up for the integrated circuit design based upon the process technology to utilized to implement the design. The ESD simulation environment is used to generate corresponding simulation runsets for the design. The simulation runsets are then used by a conventional circuit simulator to generate a set of simulation results. The simulation results are then post-processed to identify the required number of ESD protection devices needed in the design and the minimum distance that is required to place the protection devices. Based upon a predefined set of convergence criteria, simulate and analysis iterations are performed until the convergence criteria are met, resulting in the computation of the optimum number of ESD elements to be included in the circuit design.

It should be understood that the particular embodiments of the invention described above have been provided by way of example and that other modifications may occur to those skilled in the art without departing from the scope and spirit of the invention as expressed in the appended claims and their equivalents.

What is claimed is:

1. A method of dynamically checking electro static discharge (ESD) guidelines for an integrated circuit (IC) design to ensure that adequate ESD protection has been provided in the IC design, the method comprising:
   (a) providing an ESD guidelines checker that includes a calculate function for computing a desired number of ESD devices to be provided around a selected location in the IC design and an optimum size and dispersion of said devices;
   (b) providing a simulation environment for the IC design based upon a process technology to be utilized in implementing the IC design;
   (c) utilizing the simulation environment to generate corresponding simulation runsets for the IC design;
   (d) utilizing a circuit simulator to simulate the simulation runsets to generate simulation results that include trigger mechanisms for invoking the calculate function;
   (e) processing the simulation results to identify an ESD element design for the IC design;
   (f) analyzing an ESD element design to determine if the ESD element design meets predefined convergence criteria utilizing a convergence function;
   (g) if the ESD element design meets the predefined convergence criteria, utilizing the ESD element design as an optimum ESD element design for the IC design; and
   (h) if the ESD element design does not meet the predefined convergence criteria, modifying the ESD element design and iteratively performing steps (c)-(g) until the modified ESD element design meets the predefined convergence criteria.

\* \* \* \* \*